United States Patent
Lan et al.

(10) Patent No.: US 11,862,753 B2
(45) Date of Patent: Jan. 2, 2024

(54) LIGHT-EMITTING DIODE AND METHOD FOR MANUFACTURING THE SAME

(71) Applicant: Anhui San'an Optoelectronics Co., Ltd., Wuhu (CN)

(72) Inventors: Yung-Ling Lan, Wuhu (CN); Chenghung Lee, Wuhu (CN); Chan-Chan Ling, Wuhu (CN); Chia-Hao Chang, Wuhu (CN)

(73) Assignee: ANHUI SAN'AN OPTOELECTRONICS CO., LTD., Anhui (CN)

( * ) Notice: Subject to any disclaimer, the term of this patent is extended or adjusted under 35 U.S.C. 154(b) by 351 days.

(21) Appl. No.: 17/212,450

(22) Filed: Mar. 25, 2021

(65) Prior Publication Data
US 2021/0305453 A1 Sep. 30, 2021

(30) Foreign Application Priority Data
Mar. 27, 2020 (CN) .......................... 202010228719.6

(51) Int. Cl.
*H01L 33/00* (2010.01)
*H01L 33/14* (2010.01)
(Continued)

(52) U.S. Cl.
CPC .......... *H01L 33/12* (2013.01); *H01L 33/0075* (2013.01); *H01L 33/145* (2013.01);
(Continued)

(58) Field of Classification Search
CPC ... H01L 33/145; H01L 33/0075; H01L 33/06; H01L 33/382; H01L 33/12; H01L 33/32;
(Continued)

(56) References Cited

U.S. PATENT DOCUMENTS 10,700,235 B2 * 6/2020 Okuno ................. H01L 33/0093
2002/0038866 A1 * 4/2002 Nakatsu ................. H01L 33/06
257/98
(Continued)

FOREIGN PATENT DOCUMENTS

| CN | 109346575 A | 2/2019 |
| CN | 208589459 U | 3/2019 |
| CN | 210073906 U | 2/2020 |

OTHER PUBLICATIONS

Search Report appended to an Office Action, which was issued to Chinese counterpart application No. 202010228719.6 by the CNIPA dated Mar. 3, 2021 with an English translation thereof.

*Primary Examiner* — Savitri Mulpuri
(74) *Attorney, Agent, or Firm* — Thomas | Horstemeyer, LLP

(57) ABSTRACT

A light-emitting diode includes a first type semiconductor layer, a stress relief layer disposed on the first type semiconductor layer and including at least one first repeating unit containing a first well layer and a first barrier layer that are alternately stacked, an active layer disposed on the stress relief layer and including at least one second repeating unit containing a second well layer and a second barrier layer that are alternately stacked, a second type semiconductor layer disposed on the active layer, a first electrode electrically connected to the first type semiconductor layer, and a second electrode electrically connected to the second type semiconductor layer. The first well layer is made of an In-containing material. The second well layer is made of an In-containing material. The second barrier layer is formed with multiple sub-layers, each of which is made of an Al-containing material.

20 Claims, 1 Drawing Sheet

(51) Int. Cl.
 *H01L 33/12* (2010.01)
 *H01L 33/32* (2010.01)
 *H01L 33/38* (2010.01)

(52) U.S. Cl.
 CPC ............ *H01L 33/32* (2013.01); *H01L 33/382* (2013.01); *H01L 2933/0016* (2013.01)

(58) Field of Classification Search
 CPC ....... H01L 33/44; H01L 33/007; H01L 33/38; H01L 2933/0016
 See application file for complete search history.

(56) References Cited

U.S. PATENT DOCUMENTS

| | | | |
|---|---|---|---|
| 2003/0048822 A1* | 3/2003 | Nakatsu | H01L 33/145 257/E33.068 |
| 2020/0052155 A1* | 2/2020 | Jiang | H01L 33/0075 |

* cited by examiner

semiconductor layers, thereby adversely affecting an efficiency of the light-emitting diode.

SUMMARY

Therefore, an object of the disclosure is to provide a light-emitting diode that can alleviate or eliminate at least one of the drawbacks of the prior-art.

According to one aspect of the disclosure, a light-emitting diode includes a first type semiconductor layer, a stress relief layer that is disposed on the first type semiconductor layer and that includes at least one first repeating unit containing a first well layer and a first barrier layer being alternately stacked, an active layer that is disposed on the stress relief layer opposite to the first type semiconductor layer and that includes at least one second repeating unit containing a second well layer and a second barrier layer being alternately stacked, a second type semiconductor layer disposed on the active layer opposite to the stress relief layer, a first electrode electrically connected to the first type semiconductor layer, and a second electrode electrically connected to the second type semiconductor layer.

The first well layer is made of a material including In, and the second well layer is made of a material including In. The second barrier layer is formed with multiple sub-layers, each of which is made of a material including Al.

According to another aspect of the disclosure, a method for making a light emitting diode includes the steps of: forming a first type semiconductor layer; forming a stress relief layer on an upper-surface of the first type semiconductor layer; forming an active layer on the stress relief layer opposite to the first type semiconductor layer; forming a second type semiconductor layer on the active layer opposite to the stress relief layer; and electrically connecting a first electrode to the first type semiconductor layer and electrically connecting a second electrode to the second type semiconductor layer.

The first well layer is made of a material including In, and the second well layer is made of a material including In. The second barrier layer is formed with multiple sub-layers, each of which is made of a material including Al.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
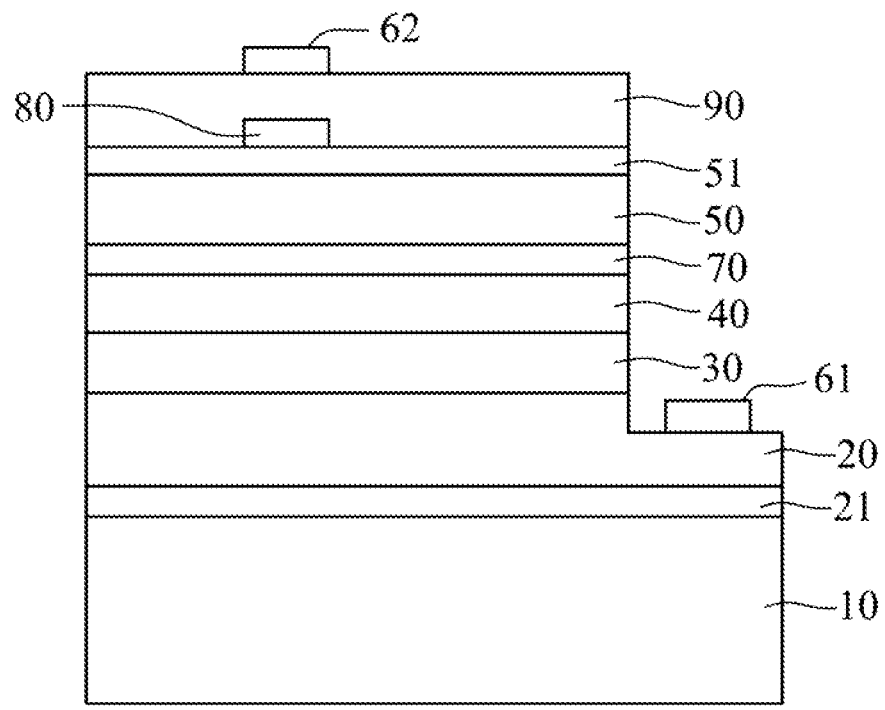
FIG. 1 is a schematic view illustrating a light-emitting diode in accordance with the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a light-emitting diode (LED) structure in accordance with an embodiment of the disclosure includes a substrate 10, a first type semiconductor layer 20, a stress relief layer 30, an active layer 40, a second type semiconductor layer 50, a first electrode 61, and a second

LIGHT-EMITTING DIODE AND METHOD FOR MANUFACTURING THE SAME

CROSS-REFERENCE TO RELATED APPLICATION

This application claims priority of Chinese Invention Patent Application No. 202010228719.6, filed on Mar. 27, 2020.

FIELD

The disclosure relates to a semiconductor technology, and more particularly to a light-emitting diode and a method for manufacturing the same.

BACKGROUND

A light-emitting diode (LED) is a device made of semiconductor materials, and is a solid-state light source that can directly convert electricity into light. The light-emitting diode has been a ubiquitous electronic product in daily life due to less environmental concerns (such as Hg-free), small volume, long lifetime, low drive voltage, low heat radiation, low power consumption, low warm-up time, characteristic of monochrome, and capability of meeting the needs of various application equipment that are light, thin or miniaturized.

A wavelength of light emitted from the light-emitting diode is determined by an energy bandgap of semiconductor materials used for making the light-emitting diode. In recent years, the light-emitting diode is mainly made of group-III nitride-based compound semiconductors, such as gallium nitride (GaN), aluminum nitride (AlN), aluminum gallium nitride (AlGaN), indium gallium nitride (InGaN), aluminum indium gallium nitride (AlInGaN), etc. It is known that GaN-based compound semiconductors have a high thermal stability and a wide energy bandgap that ranges from 0.8 eV to 2 eV. Further, a semiconductor layer is configurable to emit one of green, blue and white light, while GaN-based compound semiconductors could be combined with indium (In), aluminum (Al), etc. to form alloys. Therefore, in group-III nitride-based, semiconductor devices, n-type GaN is generally used to form an n-type conductive layer and p-type GaN is generally used to form a p-type conductive layer.

However, GaN-based compound semiconductor is relatively difficult to be obtained in epitaxial growth, mainly because of lack of a suitable substrate (e.g., a wafer formed of GaN, InN or AlN, etc.) having lattice constant and coefficient of thermal expansion similar to those of GaN. Even though a light-emitting diode structure could be epitaxially grown on materials such as sapphire, etc., a lattice mismatch between GaN and sapphire might cause defects which might extend from a sapphire substrate to interior of semiconductor layers during epitaxial growth of the semiconductor layers, and such defects might severely affect the characteristics of the light-emitting diode.

In addition, the difference of lattice constant and coefficient of thermal expansion could also exist between semiconductor layers epitaxially grown on the substrate, and such difference would lead to severe lattice mismatch and thermal mismatch. Stress induced by the resultant mismatch might generate a lot of cracks and defects with increased thickness of the semiconductor layers, and the cracks and defects would further result in a leakage current path in the electrode 62. The first type semiconductor layer 20 is disposed on the substrate 10. The stress relief layer 30 is disposed, on the first type semi conductor layer 20 opposite to the substrate 10, and includes at least one first repeating unit. The first repeating unit contains a first well layer 31 and a first barrier layer 32 that are alternately stacked. The active layer 40 is disposed on the stress relief layer 30 opposite to the first type semiconductor layer 20, and includes one second repeating unit. The second repeating unit contains a second well layer 41 and a second barrier layer 42 that are alternately stacked. The second type semiconductor layer 50 is disposed on the active layer 40 opposite to the stress relief layer 30. The first electrode 61 is electrically connected to the first type semiconductor layer 20. The second electrode 62 is electrically connected to the second type semiconductor layer 50.

The first well layer 31 is made of a material including In. The second well layer 41 is made of a material including In. The second barrier layer 42 is formed with multiple sub-layers, each of which is made of a material including Al.

The substrate 10 is selected from the group consisting of sapphire ($Al_2O_3$), SiC, GaAs, GaN, ZnO, Si, GaP, InP, Ge, and combinations thereof. Preferably, the substrate 10 is made of sapphire, such as a plane sapphire substrate or a patterned sapphire substrate (PSS, not shown), but is not limited thereto.

A multi-layered semiconductor, which is layer-by-layer disposed on one of a surface of the substrate 10 such as c-plane of PSS, includes the first type semiconductor layer 20 doped with n-type dopants, the second type semiconductor layer 50 doped with p-type dopants, and the active layer 40 for emitting light. That is, the first type semiconductor layer 20 is an n-type semiconductor layer, and the second type semiconductor layer 50 is a p-type semiconductor layer. The multi-layered semiconductor may be made of group III-V nitride-based materials, such as GaN, InN, AlN, InGaN, AlGaN and/or AlInGaN, etc., but are not limited thereto. Examples of n-type dopants may be Si, Ge, Sn, Te, O, C, etc., and examples of p-type dopants may be Mg, Zn, Be, Ca, etc., but are not limited thereto.

Figure 2:
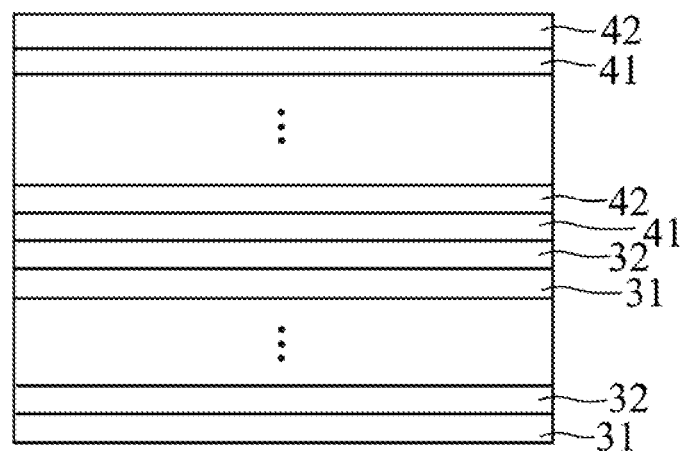
FIG. 2 is a schematic view illustrating a stress relief layer and an active layer of the light-emitting diode in accordance with the disclosure.

Referring to FIG. 2, a structure of the stress relief layer 30 and the active layer 40 in accordance with the embodiment of the disclosure is illustrated.

The active layer 40 is a region where electron-hole recombination occurs and energy of electron-hole recombination emerges as photons of light. In some embodiments, the active layer 40 includes a multi-quantum well structure. The active layer 40 is formed as a superlattice structure having the second well layer 41 and the second barrier layer 42 that are periodically and alternately stacked. In some embodiments, the active layer 40 has at least two repeating units, and the second well layers 41 and the second barrier layers 42 of the repeating units are alternately stacked on one another. The number of the repeating units can be reduced by increasing a thickness of the second well layer 41 or the second barrier layer 42.

In some embodiments, the second well layer 41 is made of a material including In. The second well layer 41 may be formed as a single-layer structure or a multi-layered structure having multiple sub-layers. In the case that the second well layer 41 has a multi-layered structure, the In contents of the sub-layers of the multi-layered structure of the second well layer 41 may be different from one another, e.g., adjusting the In contents of the sub-layers to be varied in certain sequence or adjusting a thickness of each of the sub-layers, so that the energy bandgaps of the sub-layers of the multi-layered structure of the second well layer 41 may be different and adjustable.

The second barrier layer 42 is made of a material including Al, and may be formed as a multi-layered structure having multiple sub-layers, each of which is made of a material including Al. Similarly, the Al contents of the sub-layers of the multi-layered structure of the second barrier layer 42 may be different from one another, e.g., adjusting the Al contents of the sub-layers of the second barrier layer 42 to be varied in certain sequence or adjusting a thickness of each of the sub-layers of the second barrier layer 42, so that the energy bandgaps of the sub-layers of the multi-layered structure of the second, barrier layer 42 may be different and adjustable.

Conventionally, the active layer 40 is directly disposed on the first type semiconductor layer 20 (i.e., the n-doped semiconductor layer). However, a mismatch of lattice constant and coefficient of thermal expansion between the active layer 40 and the first type semiconductor layer 20 would induce stress, thus generating a lot of cracks and defects in materials, resulting in a leakage current path in multiple semiconductor layers thus formed. In addition, the lattice mismatch would also lead to piezoelectric polarisation which induces bending of an energy band structure of the active layer 40, resulting in internal quantum efficiency droop, which is the so-called quantum confined Stark effect.

Therefore, in this embodiment, the stress relief layer 30 is disposed between the active layer 10 and the first type semiconductor layer 20 (i.e., the n-doped semiconductor layer) to lower a defect density and reduce the stress of multi-quantum well in the active layer 40 to obtain a higher luminous intensity.

The stress relief layer 30 is formed as a superlattice structure having the first well layer 31 and the first barrier layer 32 that are periodically and alternately stacked. In sortie embodiments, the stress relief layer 30 has at least two repeating units, and the first well layers 31 and the first barrier layers 32 of the repeating units of the stress relief layer 30 are alternately stacked on one another. The number of the repeating units of the stress relief layer 30 can be reduced by increasing a thickness of the first well layer 31 or that of the first barrier layer 32.

In some embodiments, the first well layer 31 is made of a material including In, and may be formed as a single-layer structure or a multi-layered structure having multiple sub-layers. In the case that the first well layer 31 has a multi-layered structure, the In contents of the sub-layers of the multi-layered structure of the first well layer 31 may be different from one another, e.g., adjusting the In contents of the sub-layers to be varied in certain sequence or adjusting a thickness of each of the sub-layers, so that the energy bandgaps of the sub-layers of the multi-layered structure of the first well layer 31 may be different and adjustable.

The first barrier layer 32 is made of an Al-containing or an Al-free material, and may be formed as a single-layer structure or a multi-layered structure having multiple sub-layers. In some embodiments, the energy bandgap(s) of the sub-layer(s) of the first barrier layer 32 is adjustable by changing the Al content or a thickness of the sub-layer(s) of the first barrier layer 32.

In some embodiments, the material for making the first well layer 31 is represented by a chemical formula of $In_{x1}Ga_{(1-x1)}N$, and the material for making the first barrier layer 32 is represented by a chemical formula of $Al_{y1}In_{z1}Ga_{(1-y1-z1)}N$, where $0 < x1 \leq 1$, $0 \leq y1 \leq 1$, and $0 \leq z1 \leq 1$. The material for snaking the second well layer 41 is represented by a chemical formula of $In_{x2}Ga_{(1-x2)}N$, and the material for making the second barrier layer 42 is represented by a chemical formula of $Al_{y2}In_{x2}Ga_{(1-y2-z2)}N$, where $0<x2\leq1$, $0\leq y21$, and $0\leq z2<1$.

In certain embodiments, the first well layer 31 is made of InGaN, the first barrier layer 32 is made of GaN, the second well layer 41 is made of InGaN, and the second barrier layer 42 is made of AlGaN, where x1 ranges from 0.02 to 0.2, x2 ranges from 0.15 to 0.35 and y2 ranges from 0.15 to 0.35.

In some embodiments, when x2 ranges from 0.15 to 0.25, the LED is configured to emit blue light, and when x2 ranges from 0.15 to 0.35, the LED is configured to emit green right.

An energy bandgap of a group III-V compound semiconductor will be varied according to its alloy composition. Hence, the energy bandgap of a semiconductor material can be altered by controlling the alloy composition of the same to meet desired corresponding properties. In this disclosure, the stress relief layer 30 has an average energy bandgap that is smaller than an average energy bandgap of the active layer 40. In some embodiments, the first well layer 31 has an energy bandgap that is greater than an energy bandgap of the second well layer 41 by adjusting the In contents of the same, and the first barrier layer 32 has an energy bandgap that is smaller than an energy bandgap of the second barrier layer 42 by adjusting the Al contents of the same. Therefore, the first well layer 31 has an In content that is smaller than that or the second well layer 41. By adjusting the alloy composition, the quality of epitaxial growth of the active layer 40 can be further improved.

A conventional LED faces a technical dilemma between a reduction in efficiency droop and an improvement in the quality of epitaxial growth of a barrier layer with quantum wells. The conventional LED is prone to have efficiency droop induced by piezoelectric polarization under high current density. One conventional approach to improve efficiency droop is to make the barrier layer with quantum wells in an active layer thinner, however, such approach would result in a lower epitaxial growth quality of the barrier layer which affects the quality of the active layer. Conventionally, an active layer that is thick tends to guarantee a good quality of quantum wells.

In comparison to the conventional active layer having a thicker barrier layer to achieve a better epitaxial growth quality of multi-quantum well, which leads to higher light attenuation, in this disclosure, a thinner barrier layer with quantum wells (i.e., the second barrier layer 42) under the premise of maintaining a nigh quality epitaxial growth of the active layer 40 can be achieved by adjusting the Al content (y2) in each of the sub-layers of the multi-layered structure of the second barrier layer 42.

Referring to FIG. 1, in some embodiments, the first electrode 61 is disposed on an electrode contact region of the first type semiconductor layer 20, which is an upper surface of the first type semiconductor layer 20 spaced apart from the stress relief layer 30, and the second electrode 62 is disposed on the first type semiconductor layer 50, so as to form a horizontal LED structure.

In some embodiments, the first type semiconductor layer 20 is formed as a multi-layered structure having multiple sub-layers. The sub-layer in the electrode contact region farthest away from the substrate 10 is doped with n-type dopant, such as Si, Ge, Sn, Te, O, C, etc., but are not limited thereto, and this sub-layer of the electrode contact region in contact with the first electrode 61 has a doping concentration that is greater than $8\times10^{18}$ $cm^{-3}$.

The electrode contact region is formed by an etching process to remove from top to down, portions of the second type semiconductor layer 50, the active layer 40, the stress relief layer 30 and the first type semiconductor layer 20, and then the etching process is stopped at the first type semiconductor layer 20, so that an upper surface of the first type semiconductor layer 20 which is relatively far away from the substrate 10 is exposed. The etching process is selected from dry etching with plasma or wet etching with corrosion using a mixed acid solution. The LED further includes a buffer layer 21 disposed on the first type semiconductor layer 20 opposite to the stress relief layer 30 so as to alleviate a lattice mismatch between the substrate 10 and the first type semiconductor layer 20. A material of the buffer layer 21 includes undoped GaN (uGaN) or AlN, etc., but is not limited thereto.

Mobility of electrons, which are a major carrier in the first type semiconductor layer 20, is higher than mobility of holes, which are a major carrier in the second type semiconductor layer 50. Hence, the electrons tend to overflow to the second type semiconductor layer 50, which reduces luminous efficiency of the LED. Therefore, in some embodiments, the LED further includes an electron blocking layer 70 disposed between the second type semiconductor layer 50 and the active layer 40 for blocking the electron overflow. A material of the electron blocking layer 70 includes AlGaN, but is not limited thereto. The electron blocking layer 70 has a much higher energy bandgap than that of the active layer 40 and the first type semiconductor layer 20, so that the electron blocking layer 70 functions as a buffer or a barrier to electrons, and further increases luminous efficiency, reduces forward voltage of the LED chip, reduces energy consumption and extends lifetime of LED.

The LED further includes a current spreading layer 90 disposed be tureen the second type semiconductor layer 50 and the second electrode 62. In the absence of the current spreading layer 90, due to doping concentration of p-type dopant in the second type semiconductor layer 50 being lower than that of n-type dopant in the first type semiconductor layer 20, a good ohmic contact could not be formed between the second electrode 62 (i.e., P-type electrode) and the second type semiconductor layer 50 (i.e., p-type semiconductor layer). Hence, the current spreading layer 90 aims to reduce the contact resistance of the contacting surface between the second type semiconductor layer 50 and the second electrode 62. Examples of the material suitable for forming the current spreading layer 90 include indium tin oxide (ITO), indium zinc oxide (IZO), zinc oxide (ZnO), nickel oxide (NiO), cadmium tin oxide (CTO), ZnO:Al, $ZnGa_2O_4$, $SnO_2$:Sb, $Ga_3O$:Sn, $AgInO_2$:Sn, $In_2O_3$:Zn, $CuAlO_2$, LaCuOS, $CuGaO_2$, $SrCu_2O_2$, and combinations thereof, but are not limited thereto. Preferably, the current spreading layer 90 is made of ITO owing to excellent transparency of ITO.

The LED further includes a current blocking layer 80 disposed between the second type semiconductor layer 50 and the current spreading layer 90. In the conventional LED, a current flow tends to choose the shortest path from the second electrode 62 to the first electrode 61. Hence, the current tends to accumulate below the second electrode 62, and flows vertically through the second type semiconductor layer 50 and the active layer 40. That is, the current only flows through a central region of the second type semiconductor layer 50 and the active layer 40, and not through a surrounding region of the second type semiconductor layer 50 and the active layer 40, i.e., a phenomenon known as current crowding effect. Hence, electrons and holes in the surrounding region of the second type semiconductor layer 50 and the active layer 20 can not be activated, and electron-hole recombination only occurs in the central region of the second type semiconductor layer 50 and the active layer 25 where the energy of electron-hole recombination emerges as photons of light. In order to improve the phenomenon of current-crowding effect below the second electrode 62, the current blocking layer 80 is disposed on the second type semiconductor layer 50 (i.e., p-type semiconductor layer). The current blocking layer 80 has a projected image on the substrate 10 the same with that of the second electrode 62 (i.e., P-type electrode), i.e., the current blocking layer 30 has a top-down correspondence relationship with the second electrode 62. The current blocking layer 80 is generally formed of insulators without conductivity, so that the current injected from the second electrode 62 tends to first flow horizontally along a surface of the current blocking layer 50, and then is vertically injected into the second type semiconductor layer 50 (i.e., P-type semiconductor layer) rather than flowing vertically through the current blocking layer 80 directly. Thus, the phenomenon of current crowding effect below the second electrode 62 (i.e., P-type electrode) is improved. In this embodiment, the current blocking layer 80 only has a top-down correspondence relationship with the second electrode 62, that is, the current blocking layer 80 only partially covers the second type semiconductor layer 50. Evidently, if the current blocking layer 80 entirely covers the second type semiconductor layer 50, the LED will be inefficient in emitting light. Hence, in some embodiments, the current spreading layer 90 is disposed on the remaining region of the second type semiconductor layer 50 which is not covered by the current blocking layer 80 to facilitate current spreading.

The LED further includes a contact resistance reducing layer 51 disposed between the second type semiconductor layer 50 and the second electrode 62. In some embodiments, the contact resistance reducing layer 51 is disposed between the second type semiconductor layer 50 and the current spreading layer 90 to reduce the contact resistance of the contacting surface between the second type semiconductor layer 50 and the current spreading layer 90.

The first electrode €1 and the second electrode 62 are both formed as metal electrodes, and are independently formed as a multi-layered structure having multiple metal sub-layers made of multiple materials. Examples of the material suitable for forming the first electrode 61 and the second electrode 62 include nickel (Ni), palladium (Pd), platinum. (Pt), chromium (Cr), gold (Au), titanium (Ti), silver (Ag), aluminum (Ax), germanium (Ge), tungsten (W), tungsten silicide (SiW), Tantalum (Ta), Au—Zn alloy (AuZn), Au—Be alloy (AuBe), Au—Ge alloy (AuGe), Au—Ge—Ni alloy (AuGeNi), and combinations thereof, but are not limited thereto. In some embodiments, a metal sub-layer of the second electrode 62 closest to the substrate 10 and in contact with the current spreading layer 30 is made of a metal (e.g., Au) that has a good adhesion, a low contact resistance and a high conductivity.

An embodiment of a method for making an LED of the disclosure includes the steps of preparing a substrate IQ, forming a first type semiconductor layer 20 on a surface of the substrate 10, forming a stress relief layer 30 on an upper surface of the first type semiconductor layer 20 opposite to the substrate 10, forming an active layer 40 the stress relief layer 30 opposite to the first type semiconductor layer 20, forming a second type semiconductor layer 50 on the active layer 40 opposite to the stress relief layer 30, electrically connecting a first electrode 61 to the first type semiconductor layer 20, and electrically connecting a second electrode 62 to the second type semiconductor layer 50. The step of electrically connecting the first electrode 61 to the first type semiconductor layer 20 further includes an etching process implemented by etching away from top to down, portions of the second type semiconductor layer 50, the active layer 40, the stress relief layer 30 and the first type semi conductor layer 20, and then stopping at the first type semiconductor layer 20 to expose an electrode contact region for forming the first electrode 61.

In this embodiment, the first well layer 31 is made of the material including In, the second well layer 41 is made of the material including In, the first barrier layer 32 is made of an Al-containing or an Al-free material, and the second barrier layer 42 is formed as a multi-layered structure having multiple sub-layers, each of which is made of a material including Al. The energy bandgap of the stress relief layer 30 and the active layer 40 can be adjusted by changing material species, dopant concentrations or thickness of the stress relief layer 30 and the active layer 40.

In summary, by disposing the stress relief layer 30 between the active layer 40 and the first type semiconductor layer 20, the stress of multi-quantum well in the active layer 40 can be reduced to achieve a high quality epitaxial growth of the active layer 40.

In addition, since the stress relief layer 30 has an average energy bandgap that is smaller than that of the active layer 40, the first well layer 31 has an energy bandgap greater than that of the second well layer 41, and the first barrier layer 32 has an energy bandgap smaller than that of the second barrier layer 42, the quality of epitaxial growth of the active layer 40 can be further improved.

Furthermore, by forming the second barrier layer 42 in the active layer 10 as a multi-layered structure having multiple sub-layers that are made of a material including Al, and by adjusting the composition of Al in each of the sub-layers, the second barrier layer 42 can be made thinner while maintaining a high quality epitaxial growth of the active layer 40, in comparison to a conventional active layer with thicker barrier layers, so as to alleviate light attenuation.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment (s), it is understood that this embodiment(s) is not intended to cover various arrangements included within the spirit and scope of the broadest interpretation so as to encompass all such modifications and equivalent arrangements.

What is claimed is:
1. A light-emitting diode, comprising:
    a first type semiconductor layer having an upper surface;
    a stress relief layer that is disposed on said upper surface of said first type semiconductor layer and that includes at least one first repeating unit containing a first well layer and a first barrier layer being alternately stacked;

an active layer that is disposed on said stress relief layer opposite to said first type semiconductor layer and that includes at least one second repeating unit containing a second well layer and a second barrier layer being alternately stacked;

a second type semiconductor layer disposed on said active layer opposite to said stress relief layer;

a first electrode electrically connected to said first type semiconductor layer; and a second electrode electrically connected to said second type semiconductor layer, wherein, said first well layer is made of a material including In; said second well layer is made of a material including In; said second barrier layer is formed with multiple sub-layers, each of said sub-layers being made of a material including Al.

2. The light-emitting diode of claim 1, wherein said stress relief layer has an average energy bandgap that is smaller than an average energy bandgap of said active layer.

3. The light-emitting diode of claim 1, wherein said first well layer has an energy bandgap that is greater than an energy bandgap of said second well layer.

4. The light-emitting diode of claim 1, wherein said first barrier layer has an energy bandgap that is smaller than an energy bandgap of said second barrier layer.

5. The light-emitting diode of claim 1, wherein said first well layer has an indium (In) content that is smaller than an indium (In) content of said second well layer.

6. The light-emitting diode of claim 1, wherein the material for making said first well layer is represented by a chemical formula of $In_{x1}Ga_{(1-x1)}N$, and a material for making said first barrier layer is represented by a chemical formula of $Al_{y1}In_{z1}Ga_{(1-y1-z1)}N$, where $0<x1\leq1$, $0\leq y1\leq1$, and $0\leq z1\leq1$.

7. The light-emitting diode of claim 6, wherein x1 ranges from 0.02 to 0.2.

8. The light-emitting diode of claim 1, wherein the material for making said second well layer is represented by a chemical formula of $In_{x2}Ga_{(1-x2)}N$, and the material for making said second barrier layer is represented by a chemical formula of $Al_{y2}In_{z2}Ga_{(1-y2-z2)}N$, where $0<x2\leq1$, $0<y2\leq1$, and $0\leq z2<1$.

9. The light-emitting diode of claim 8, wherein x2 ranges from 0.15 to 0.35.

10. The light-emitting diode of claim 1, wherein said stress relief unit includes a plurality of first repeating units each containing said first well layer and said first barrier layer, said first well layers and said first barrier layers in said stress relief unit being alternately stacked on one another.

11. The light-emitting diode of claim 1, wherein said active layer includes a plurality of second repeating units each containing said second well layer and said second barrier layer, said second well layers and said second barrier layers in said active layer being alternately stacked on one another.

12. The light-emitting diode of claim 1, wherein each of said first well layer, said first barrier layer and said second well layer is independently formed as one of a single-layer structure and a multi-layered structure having multiple sub-layers.

13. The light-emitting diode of claim 12, wherein said sub-layers of each of said first well layer, said first barrier layer, said second well layer and said second barrier layer have an energy bandgap that is different from one another.

14. The light-emitting diode of claim 1, wherein said upper surface of said first type semiconductor layer has an electrode contact region which is spaced apart from said stress relief layer and which has a doping concentration that is greater than $8\times10^{18}$ cm$^{-3}$, said first electrode being disposed on said electrode contact region.

15. The light-emitting diode of claim 1, further comprising an electron blocking layer disposed between said second type semiconductor layer and said active layer.

16. The light-emitting diode of claim 1, further comprising a contact resistance reducing layer disposed between said second type semiconductor layer and said second electrode.

17. The light-emitting diode of claim 1, further comprising a current spreading layer disposed between said second type semiconductor layer and said second electrode.

18. The light-emitting diode of claim 17, further comprising a current blocking layer disposed between said second type semiconductor layer and said current spreading layer.

19. A method for making a light emitting diode, comprising the steps of:

forming a first type semiconductor layer having an upper surface;

forming a stress relief layer on the upper surface of the first type semiconductor layer, the stress relief layer including at least one first repeating unit that contains a first well layer and a first barrier layer which are alternately stacked;

forming an active layer on the stress relief layer opposite to the first type semiconductor layer, the active layer including at least one second repeating unit that contains a second well layer and a second barrier layer which are alternately stacked;

forming a second type semiconductor layer on the active layer opposite to the stress relief layer; and electrically connecting a first electrode to the first type semiconductor layer and electrically connecting a second electrode to the second type semiconductor layer, wherein, the first well layer is made of a material including In; the second well layer is made of a material including In; the second barrier layer is formed with multiple sub-layers, each of the sub-layers being made of a material including Al.

20. The method of claim 19, wherein an energy bandgap of the stress relief layer and the active layer is adjustable by changing material species, dopant concentrations or thickness of the stress relief layer and the active layer.

* * * * *